United States Patent
Cartier, Jr.

(10) Patent No.: US 7,816,932 B2
(45) Date of Patent: Oct. 19, 2010

(54) TEST SYSTEM WITH HIGH FREQUENCY INTERPOSER

(75) Inventor: Marc B. Cartier, Jr., Dover, NH (US)

(73) Assignee: Teradyne, Inc., North Reading, MA (US)

( * ) Notice: Subject to any disclaimer, the term of this patent is extended or adjusted under 35 U.S.C. 154(b) by 316 days.

(21) Appl. No.: 12/070,864

(22) Filed: Feb. 21, 2008

(65) Prior Publication Data

US 2009/0212802 A1   Aug. 27, 2009

(51) Int. Cl.
*G01R 31/02* (2006.01)
*G01R 31/26* (2006.01)

(52) U.S. Cl. .................. 324/755; 324/765; 324/754

(58) Field of Classification Search .................. 324/754, 324/765, 761–762, 158.1, 760; 257/48; 438/14–18
See application file for complete search history.

(56) References Cited

U.S. PATENT DOCUMENTS

| | | | |
|---|---|---|---|
| 4,451,107 A | 5/1984 | Dola et al. | |
| 4,881,905 A | 11/1989 | Demler, Jr. et al. | |
| 6,344,684 B1 | 2/2002 | Hussain et al. | |
| 6,352,436 B1 | 3/2002 | Howard | |
| 6,544,072 B2 | 4/2003 | Olson | |
| 6,686,732 B2 | 2/2004 | Parrish | |
| 7,046,027 B2 | 5/2006 | Conner | |
| 7,126,362 B2 * | 10/2006 | Yoshida et al. | 324/754 |
| 7,180,321 B2 | 2/2007 | Behziz et al. | |
| 7,279,911 B2 * | 10/2007 | Tunaboylu et al. | 324/754 |
| 7,372,286 B2 * | 5/2008 | Lee et al. | 324/757 |
| 2004/0061513 A1 | 4/2004 | Sweet et al. | |
| 2006/0066330 A1 | 3/2006 | Yoshida | |
| 2006/0066331 A1 | 3/2006 | Yoshida | |

FOREIGN PATENT DOCUMENTS

| | | |
|---|---|---|
| EP | 1 482 313 A | 10/2004 |
| EP | 1 471 358 A | 12/2004 |

OTHER PUBLICATIONS

International Search Report from related PCT Application PCT/US2009/001045 mailed Jul. 22, 2009.

* cited by examiner

*Primary Examiner*—Ha Tran T Nguyen
*Assistant Examiner*—Tung X Nguyen
(74) *Attorney, Agent, or Firm*—Wolf, Greenfield & Sacks, P.C.

(57) ABSTRACT

An interposer with a conductive housing is disclosed. Conductive members pass through insulators positioned in openings in the conductive housing. The conductive housing may be grounded, providing a closely spaced ground structure for signal conductors passing through the conductive housing and therefore providing a desirable impedance to signals carried by the conductive members. Such an interposer may be used in a test system to couple high speed signals between instruments that generate or measure test signals and devices under test.

19 Claims, 11 Drawing Sheets

TEST SYSTEM WITH HIGH FREQUENCY INTERPOSER

BACKGROUND OF THE INVENTION

Interposers provide an electrical interface between two electronic assemblies, such as printed circuit boards. By providing an array of conductive members that couple to conductive pads on both electronic assemblies, the interposer can provide conductive paths carrying signals from one electronic assembly to another. In test systems, interposers can provide a separable interconnect between a device interface board, to which the devices under test (DUTs) are connected, and a tester interface board to which instruments that generate or measure test signals may be coupled.

Figure 1:
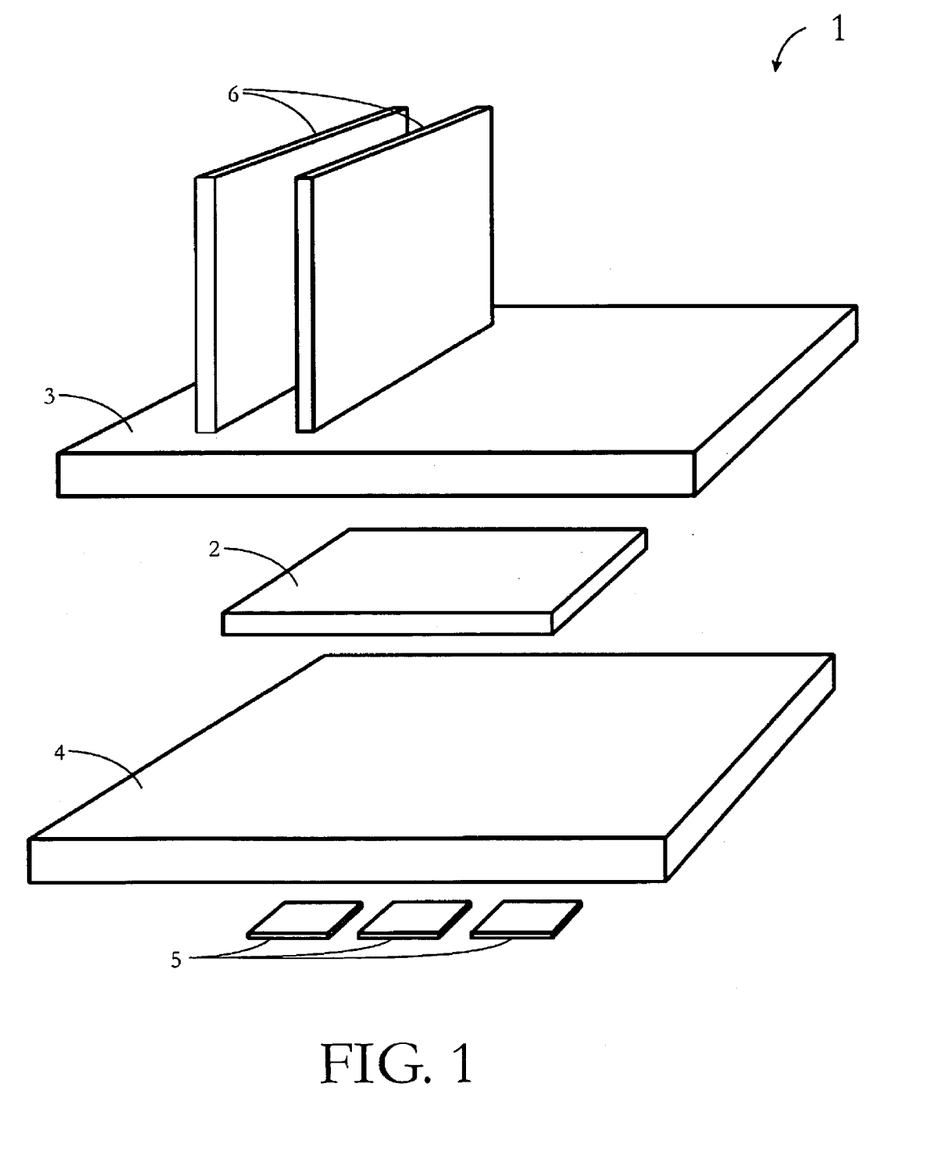
FIG. 1 is a perspective view of components of a test system.

Components of a test system are shown in FIG. 1. The test system 1 has an interposer 2, tester interface board 3, device interface board 4, DUTs 5, and instruments 6. In a test system, instruments 6 and tester interface board 3 are held within a test head, which is not shown for simplicity. Instruments 6 may be directly coupled to device interface board 4 through electrical connectors or may be coupled through cables or wires. Regardless, test signals generated or measured by instruments 6 are coupled through tester interface board 3.

Device interface board 4 may be mechanically coupled to a device handler or other apparatus that presents DUTs 5 for testing. For simplicity, the device handler also is not shown. In operation, DUTs 5 electrically connect to device interface board 4, allowing test signals to be coupled to or from DUTs 5 through device interface board 4.

Interposer 2 completes connections between device interface board 4 and tester interface board 3, allowing test signals to be coupled between instruments 6 and DUTs 5. To complete this coupling, interposer 2 makes connections between conductive pads on the lower surface of tester interface board 3 and conductive pads on the upper surface of device interface board 4.

Various mechanisms have been used to provide good electrical contact at both interfaces. These include spring contacts, dendritic contacts, "fuzz buttons", elastomeric contacts, and direct contact. The connectivity of the contacts may be enhanced by an applying a force that presses tester interface board 3 towards device interface board 4.

An interposer typically has multiple conductive contacts, forming connections from one board to the other and allowing numerous test signals to be applied to or measured on the DUTs 5. In some test systems, the integrity of signals passing through an interposer is improved by grounding some of the conductive contacts. In some instances, a grounding pattern is used in which, for each conductive contact used to carry a signal, multiple conductive contacts adjacent to that signal contact are grounded.

SUMMARY

In one aspect, the invention relates to an interposer suitable for use in a test system. The interposer may have closely spaced conducting paths, each of which has an impedance that allows high speed signals to pass through the interposer without significant corruption associated with impedance mismatch.

In some embodiments an interposer has a conductive housing with a first side and a second side. The conductive housing has holes that pass through both the first side and the second side. A plurality of insulators are at least partially embedded in the conductive housing, each in a corresponding hole. The interposer further comprises a plurality of conductive springs. Each spring has a first contact and a second contact. Each spring is partially embedded in at least one of the plurality of insulators such that the first contact of the conductive spring is exposed from the first side of the conductive housing, and the second contact of the conductive spring is exposed from the second side of the conductive housing.

In some embodiments of the interposer, the conductive housing is die-cast.

In some embodiments of the interposer, the first and second side of the conductive housing are parallel.

In some embodiments of the interposer, the holes in the conductive housing are perpendicular to the first surface.

In some embodiments of the interposer, each insulator has a first surface and a second surface opposite the first surface. The insulator is disposed in such a way that the first surface of each insulator is exposed on the first side of the conductive housing and the second surface of each insulator is exposed on the second side of the conductive housing. Further, the first contact of each spring of the plurality of conductive springs pierces the first surface of a corresponding insulator and the second contact of each spring of the plurality of conductive springs pierces the second surface of the corresponding insulator.

In some embodiments of the interposer, the first contact of each of the conductive springs has a U shaped curved, and the base of the U shape is not embedded in the corresponding insulator.

In some embodiments of the interposer, each of the plurality of insulators has a side surface adjacent to the conductive housing. This side surface is not pierced by the conductive spring.

In some embodiments of the interposer, one of the conductive springs have a gold or silver plating on at least a portion of a conductive spring among the plurality of conductive springs.

In some embodiments, the interposer has a contact for grounding the conductive housing.

In some embodiments of the interposer, the plurality of insulators each have a side surface adjacent to the conducive housing. The side surface is not pierced by the conductive spring.

In some embodiments of the interposer, the impedance measured between on of the plurality of conductive springs and the conductive housing is between 40 and 60 Ohms in the frequency range associated with data transfer rates of 2.5 and 10 Gbps.

Another embodiment is an interposer with a conductive housing having a first side and a second side. The conductive housing has holes that pass through the first side and the second side. A plurality of insulators are each at least partially embedded in a corresponding hole in the conductive housing. Each insulator has a first surface and a second surface. The first surface of each insulator is exposed from the first side of the conductive housing. The second surface of each insulator is exposed from the second side of the conductive housing. The interposer further comprises a plurality of conductive members each having a first end and a second end. Each conductive member is partially embedded in at least one insulator such that the first end of each conductive member is exposed on the first surface of the at least one insulator, and the second end of each conductive member is exposed on the second surface of the at least one insulator. The interposer additionally has a first plurality of contacts and a second plurality of contacts. The first plurality of contacts are each in contact with the first end of a corresponding conductive member. The second plurality of contacts are in contact with the second end of a corresponding conductive member.

In some embodiments of the interposer, the first plurality of contacts are elastomeric contacts.

In some embodiments of the interposer, the first plurality of contacts are elastomeric contacts and each of the elastomeric contacts is electrically insulated from the conductive housing.

In some embodiments of the interposer, the conductive housing is die-cast.

In some embodiments of the interposer, the first and second side of the conductive housing are parallel.

In some embodiments of the interposer, the interposer has a contact for grounding the conductive housing.

In some embodiments of the interposer, the interposer has an elastomeric contact for grounding the conductive housing.

Another embodiment is test system comprising a plurality of instruments, a first interface board, a second interface board, and an interposer. The plurality of instruments are adapted to generate and/or measure a test signal. The first interface board comprises a first plurality of pads on a first surface. The first interface board is adapted to couple a test signal between a pad of the first plurality of pads and an instrument of the plurality of instruments. The second interface board comprises a second plurality of pads on a second surface. The second interface board is adapted to couple a test signal between a pad of the second plurality of pads and a test point on a device under test. The interposer is disposed between the first interface board and the second interface board. The interposer has a conductive housing having a first side and a second side opposite the first side. The conductive housing has a plurality of holes that pass through the first side and the second side. The interposer has a plurality of insulators, each insulator at least partially embedded in a corresponding hole in the conductive housing. The interposer further comprises a plurality of conductive members each having a first end and a second end. Each conductive member is partially embedded in at least one of the plurality of insulators such that the first end of each conductive member is exposed from the first side of the conductive housing, and the second end of the conductive member is exposed from the second side of the conductive housing. The first end of each conductive member is coupled to a pad of the first plurality of pads and the second end of each conductive member is coupled to a pad of the second plurality of pads.

In some embodiments of the test system, the conductive housing of the interposer is die-cast metal.

In some embodiments of the test system, the test system further comprises a first plurality of contacts, a second plurality of contacts and a ground contact. Each of the first plurality of contacts is couples a first end of a conductive member of the plurality of conductive members to a pad of the first plurality of pads. Each of the second plurality of contacts is couples a second end of a conductive member of the plurality of conductive members to a pad of the second plurality of pads. The ground contact couples the conductive housing to a ground pad on at least one of the first interface board and the second interface board.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings.

DETAILED DESCRIPTION

The inventor has appreciated that a test system could be improved with an interposer providing good signal integrity for high speed signals. Prior art interposers degraded signals at data rates above 2.5 Gbps (gigabits per second). Embodiments of the invention can be manufactured with acceptable performance at data rates above 2.5 Gbps and in some embodiments beyond 10 Gbps.

The inventor has appreciated that interposer performance was limited by impedance mismatches between signal conductors in the interposer and the electronic assemblies, such as the tester interface board and/or the device interface board, joined by the interposer. For example, signal traces within these electronic assemblies may have an impedance of 50 Ohms. If the signal conductors carrying signals through the interposer similarly had an impedance of approximately 50 Ohms, reflections and signal distortion could be reduced.

Previously, to reduce impedance mismatch, conductors within the interposer were grounded. The number and position of the grounded conductors relative to the signal conductors established the impedance of the signal conductors. Impedance is, however, a function of the frequency of the signals passing through the signal conductors as well as the geometry of the signal conductors and nearby ground structures. Accordingly, interposers used in high frequency test systems require different configurations of signal and ground conductors than similar interposers used in low frequency test systems or other low frequency applications. Specifically, as the signal frequency increases, the grounded conductors must be closer to the signal conductors to maintain a desired impedance of the signal conductor.

The inventor has appreciated that data rates of approximately 2.5 Gbps and above result in signal frequencies that would require grounded conductors to be closer to signal conductors than can be readily manufactured using conventional interposer design techniques.

Figure 2:
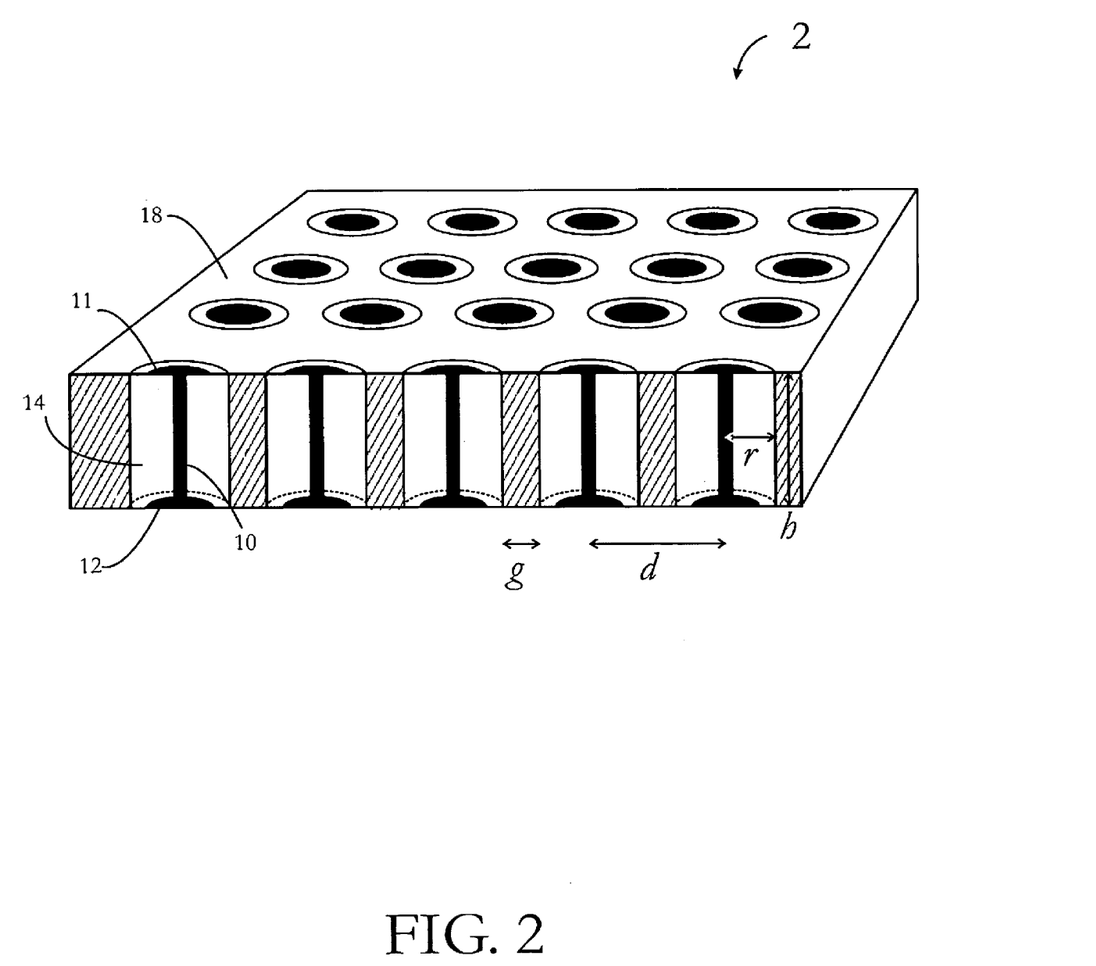
FIG. 2 is a cut away view of an interposer.

Interposers according to some embodiments of the invention provide better impedance matching and a reduction in crosstalk, even at relatively high frequencies. FIG. 2 illustrates an interposer according to an embodiment of the invention. The interposer of FIG. 2 may be used in a test system as illustrated in FIG. 1 to make electrical connections between tester interface board 3 and device interface board 4. However, the nature of the electronic assemblies connected through an interposer is not a limitation on the invention and interposers according to embodiments of the invention may be incorporated in any suitable electronic system to join any suitable electronic assemblies.

In some embodiments, interposer 2 comprises a conductive housing 18, conductive members (of which only conductive member 10 is numbered for simplicity), insulative members (of which only insulative member 14 is numbered for simplicity) and contacts (of which only contacts 11 and 12 on conductive member 10 are numbered for simplicity). Interposer 2 may contain multiple conductive members, each of which may carry a signal through interposer 2. In the embodiment illustrated in FIG. 2, multiple conductive members are positioned in parallel rows, forming a rectangular array of conductive members. However, the positioning of conductive members within interposer 2 is not crucial to the invention in any suitable arrangement of conductive members may be used.

In the embodiment illustrated, each of the conductive members has a similar shape and a similar mounting arrangement within interposer 2. This feature may simplify the construction and use of interposer 2, but is not a requirement of the invention. Each of the conductive members may have any suitable shape and be mounted within interposer 2 in any suitable way.

Because the embodiment illustrated in FIG. 2 includes multiple like rows of conductive members, any one row may be representative of the other rows. Likewise because each conductive member has a similar shape and mounting arrangement, any one conductive member may be representative of all of the conductive members. Accordingly, for simplicity, FIG. 2 illustrates a cross section through a single row of conductive members in interposer 2, which reveals only a portion of the conductive members.

Conductive housing 18 provides structural support for the interposer and contains a number of through holes. In the embodiment illustrated, each hole passes through conductive housing 18 from an upper surface to a lower surface. In this configuration, each of the holes provides a channel through conductive housing 18 to receive a conductive member.

An insulative member 14 may be positioned in each of the holes. A conductive member 10 passes through each of the insulative members 14. Accordingly, insertion of an insulative member 14 positions a conductive member within a hole through conductive housing 18. Each of the conductive members may have a first end exposed in the upper surface of conductive member 10 and a second end exposed in the lower surface of conductive member 10. In this way, each conductive member may provide a signal path through interposer 2.

In operation, conductive housing 18 may be grounded. Accordingly, each of the conductive members, such as conductive member 10, may be in relatively close proximity to a ground conductor, formed by the walls of a hole through conductive housing 10. As can be seen in the cross section of FIG. 2, each conductive member, such as conductive member 10, is spaced from the walls of the hole in which it resides by a distance approximately equal to the radius r of the hole. This distance r may be less than the distance d separating adjacent conductive members. Accordingly, grounding conductive housing 18 allows the signal-to-ground spacing to be smaller than is possible by grounding adjacent conductive members surrounding a signal conductor. Accordingly, an interposer according to embodiments of the invention may provide a lower impedance, even at relatively high frequencies, than prior art interposers in which impedance of signal conductors was controlled by grounding conductive members.

Electrical connection between the conductive members, such as conductive member 10 and electronic assemblies to be interconnected by interposer 2 may be made in any suitable way. For example, contacts, such as contacts 11 and 12, may be spring contacts, dentritic (fuzz buttons), elastomeric contacts and direct contacts.

Figure 3A:
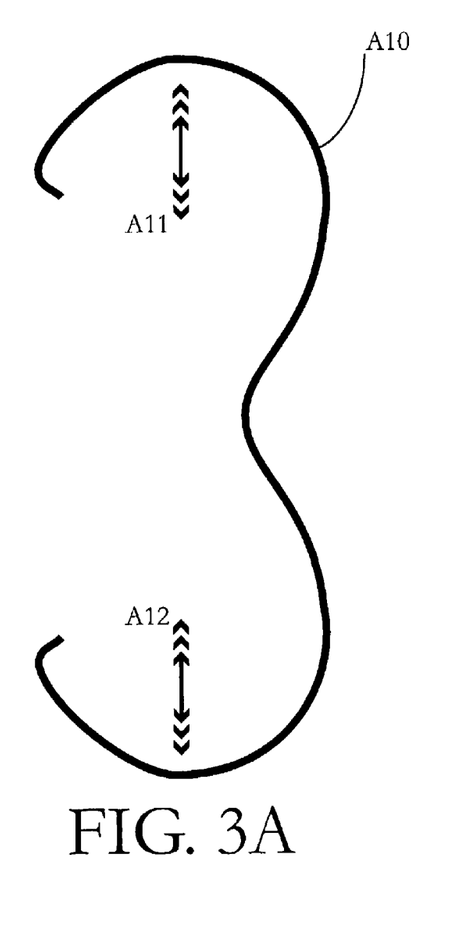
FIG. 3A is a sketch of a conductive spring type conductive member.

In some embodiments the electrical contacts 11 and 12 maybe an integral part of the conductive member 10. In the embodiment shown in FIG. 3A, conductive member 10 is a conductive spring A10 having spring contacts A11 and A12 at respective ends. The spring rate of spring contacts A11 and A12 may be set to provide a desired contact force when an interposer containing conductive member A10 is pressed against an electronic assembly. The material used to form conductive spring A10 as well as the shape of conductive spring A10 may be selected to provide the desired spring rate. In the embodiment illustrated, conductive member A10 has a serpentine shape with multiple bends. Such a shape may ensure that conductive member fits within a hole in conductive housing 18 without making electrical connection to the conductive housing 18. The serpentine shape allows the length of each of the spring contacts A11 and A12 to be longer than the distance r (FIG. 2). However, this shape is not critical to the invention and any suitable shape may be used.

Figure 3B:
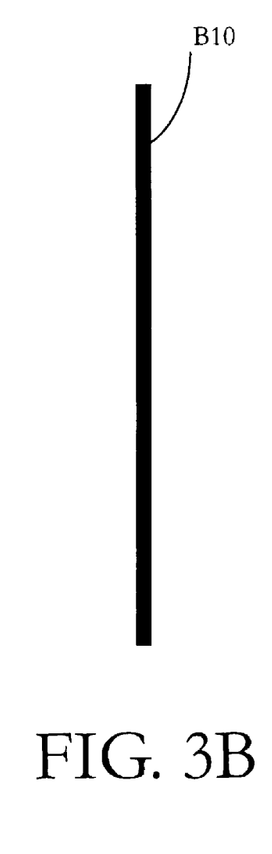
FIG. 3B is a sketch of a conductive post type conductive member.

In other embodiments, the contacts 11 and 12 may be a separate component electrically connected to conductive member 10. For example, the conductive member may be a conductive post B10 as shown in FIG. 3B. Opposing ends of conductive post B10 may be positioned to engage conducting surfaces on electronic assemblies to be joined by interposer 2. Though direct connection of one or both ends of conductive post B10 to electronic assembly may be possible, in some embodiments, intermediate compliant members may be inserted between ends of conductive post B10 and conductive structures interconnected by interposer 2 The compliant members may be contacts such as, spring contacts, dendritic contacts, "fuzz buttons", or elastomeric contacts.

Figure 4A:
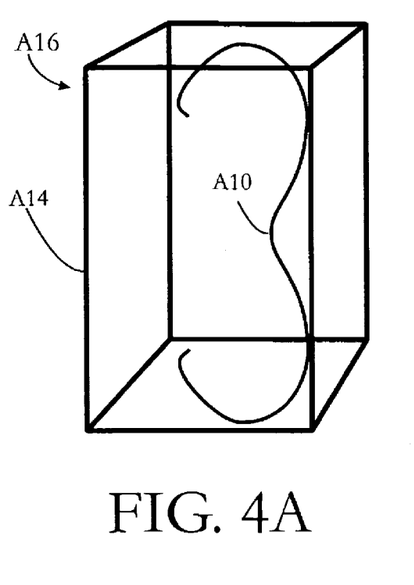
FIG. 4A is a perspective view of a rectangular insert comprising a conductive spring partially embedded in an insulator.
Figure 4B:
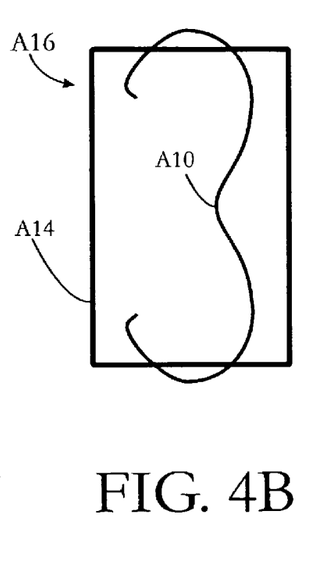
FIG. 4B is a cross-sectional side view of the rectangular insert of FIG. 4A.

In the example of the conductive spring A10, the spring contacts A11 and A12 may be exposed through surfaces of the insulative member A14, as shown in FIGS. 4A and 4B. In the embodiment illustrated, insulative member A14 is rectangular. Together the conductive spring A10 and insulator A14 form a rectangular insert A16. In the embodiment illustrated, insulative member A14 may be sized to fit within a hole in conductive housing 18. Insulative member A14 may be shaped or sized to be retained within conductive housing 18 through an interference fit, though any suitable attachment mechanism may be used. Moreover, it is not necessary that insulative member A14 completely fill a hole in conductive housing 18. Any one or more insulative members sized and shaped to provide suitable support for conductive member A10 may be used.

Figure 4C:
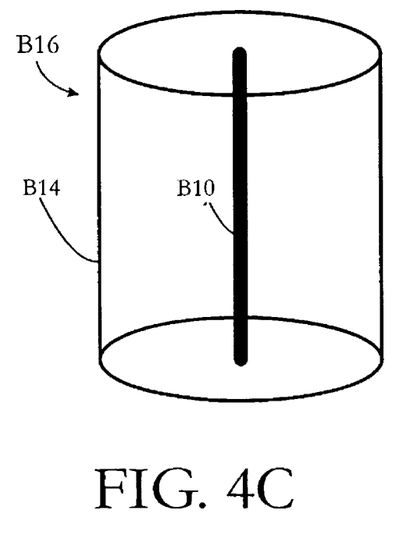
FIG. 4C is a perspective view of a cylindrical insert comprising a conductive wire partially embedded in an insulator.
Figure 4D:
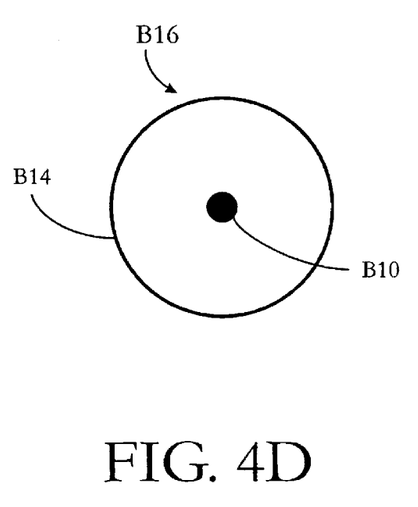
FIG. 4D is a cross-sectional top view of the cylindrical insert of FIG. 4C.
Figure 5A:
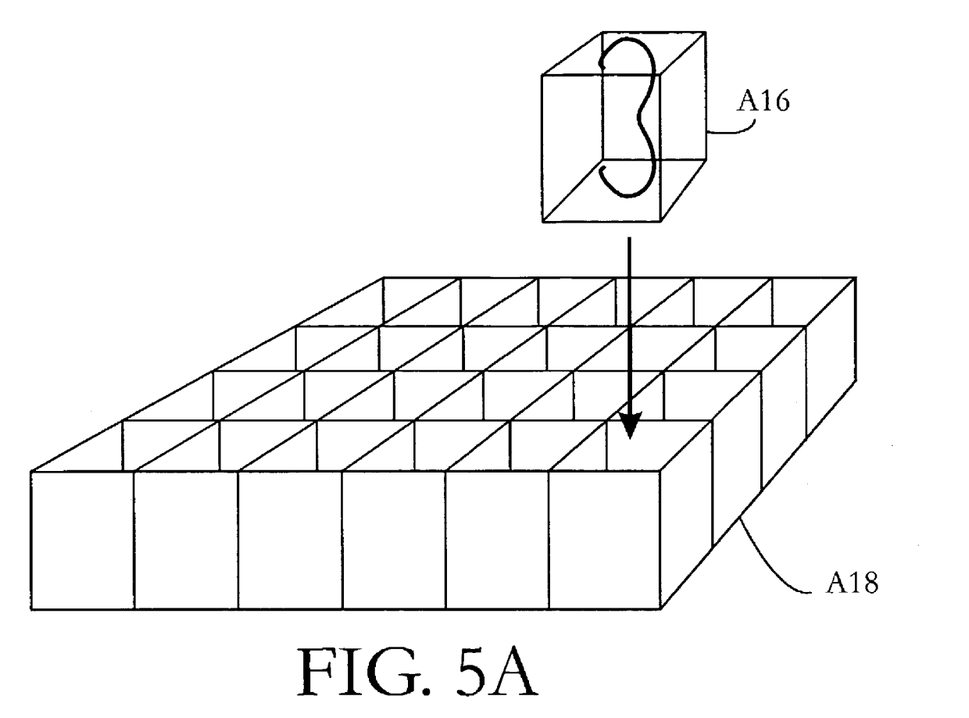
FIG. 5A is a perspective view of a thin walled conductive housing for rectangular inserts during a step of a manufacturing process.
Figure 5B:
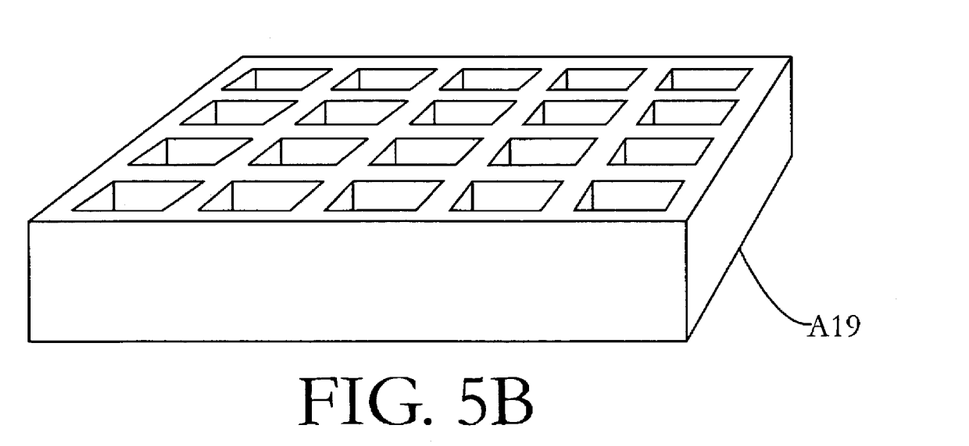
FIG. 5B is a perspective view of a thick walled conductive housing for rectangular inserts.

In the embodiment of FIGS. 4C and 4D, conductive post B10 is partially embedded in a cylindrical insulative member B14. Together the conductive post B10 and insulative member B14 form a cylindrical insert B16. The inserts A16 and B16 may be held in position by the conductive housing 18 in any suitable way. FIG. 5A shows a rectangular insert being inserted into a thin walled conductive housing A18. FIG. 5B shows a thick walled conductive housing A19 for rectangular inserts of an alternative embodiment. The wall thickness may be selected to provide a suitable spacing between conductive members while ensuring that the spacing between each signal conductor and an adjacent ground provides a desired impedance. However, any suitable wall thickness may be used and wall thickness is not critical to the invention.

Figure 5C:
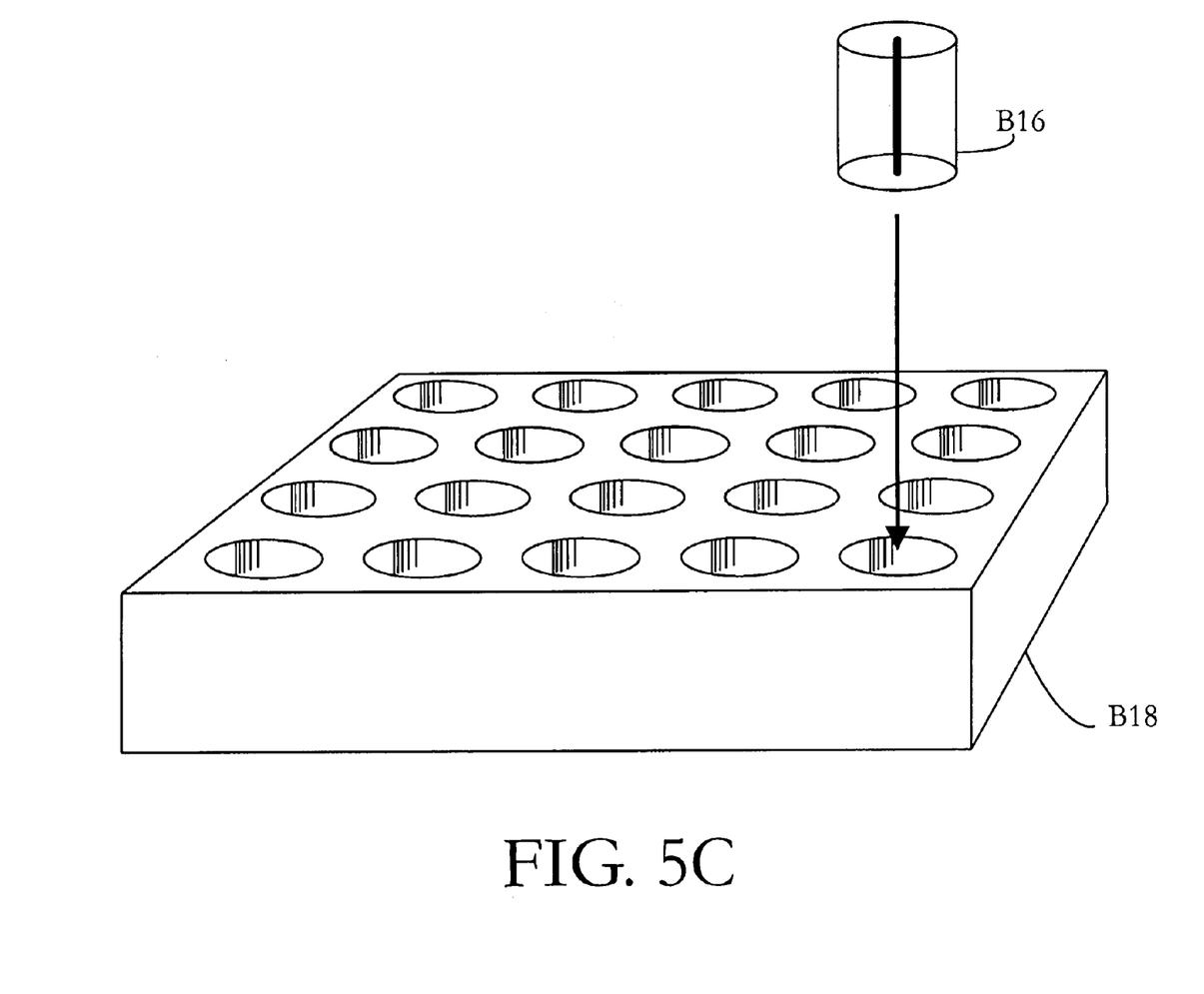
FIG. 5C is a perspective view of a conductive housing for cylindrical inserts during a step of a manufacturing process.

The shape of the holes in the conductive housing is also not critical to the invention. FIG. 5C shows a cylindrical insert being inserted into a cylindrical hole in conductive housing B18.

Interposers according to embodiments of the invention may be manufactured in any suitable way. As illustrated in FIG. 5A and FIG. 5C, a conductive housing may be formed separately from inserts, such as inserts A16 and B16. The inserts may then be secured within holes passing through the housing using any suitable manufacturing technique. Though, in other embodiments, insulative members may be molded in place by injecting insulative material into holes in a conductive housing. Conductive members may be positioned within the holes prior to injection of insulative material or inserted afterwards.

Figure 6A:
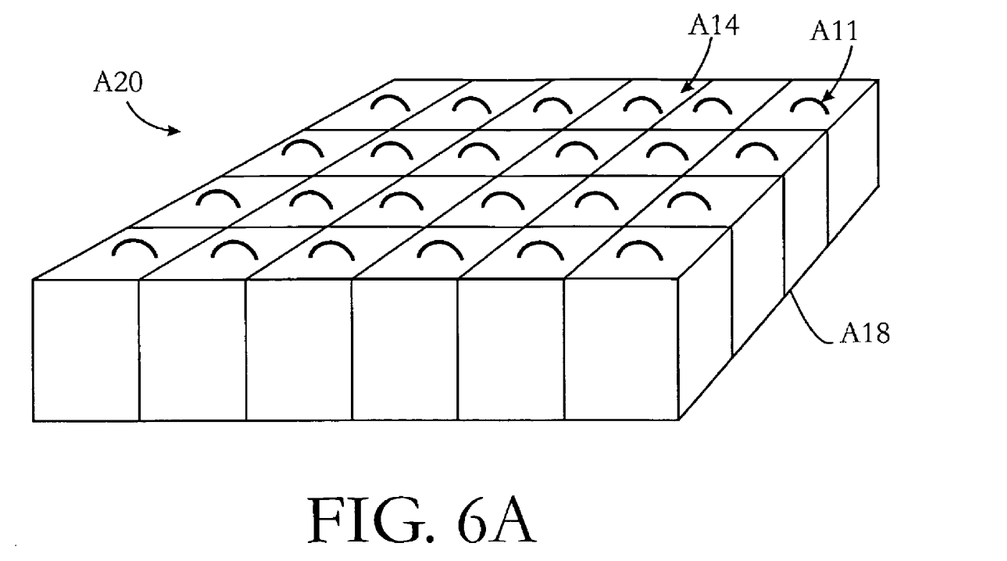
FIG. 6A is a perspective view of an interposer with a thin walled conductive housing, having rectangular inserts with conductive spring contacts embedded in an insulator.
Figure 6B:
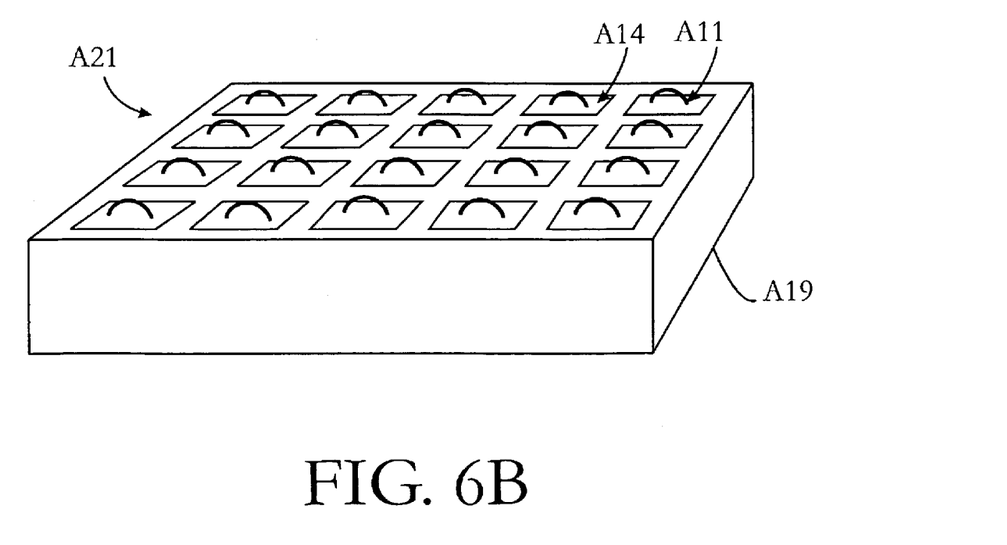
FIG. 6B is a perspective view of an interposer with a thick walled conductive housing, having rectangular inserts featuring conductive spring contacts embedded in an insulator.

FIGS. 5A, 5B and 5C represent interposers during a stage of manufacture. FIGS. 6A and 6B illustrate completed interposers A20 and A21 using the thin walled conductive housing A18 and the thick walled conductive housing A19, respectively. In both example interposers A20 and A21, inserts A16 include conductive spring A10 in the form of the conductive springs A10 and rectangular insulative members in the form of inserts A14. In this example, the contact portions are U-shaped with the base of the U extending away from the surface of the insulator, such that it is not embedded in the insulator and free to move.

Figure 6C:
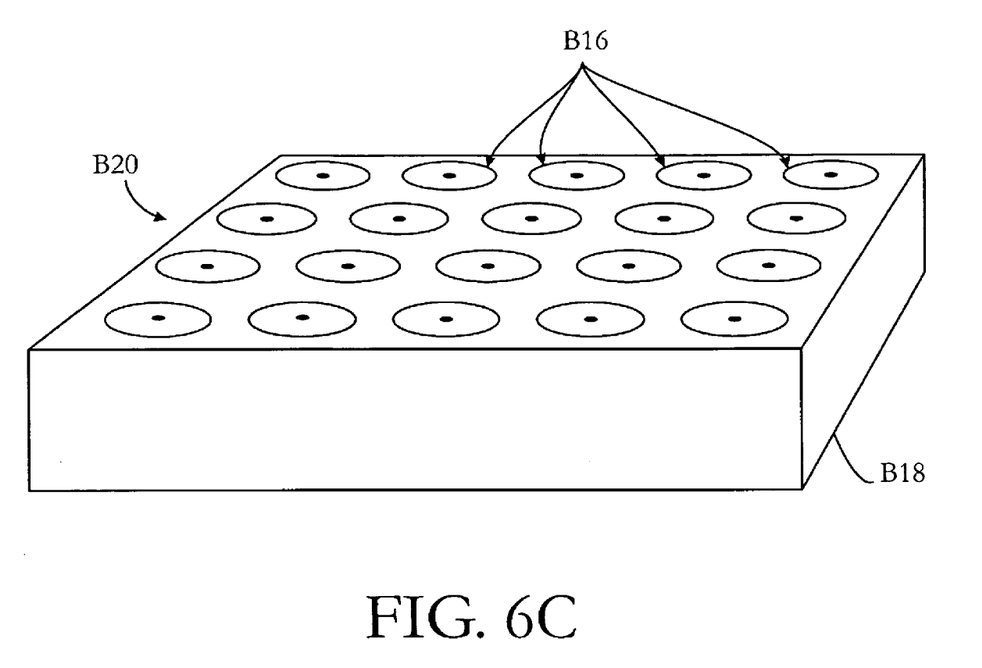
FIG. 6C is a perspective view of a conductive housing for cylindrical inserts with installed cylindrical inserts having a conductive post contact partially embedded in an insulator.

FIG. 6C shows a portion of an interposer B20 with inserts B16 and conductive housing B18. In the embodiment illustrated, inserts B16 contain conductive members in the form of conductive post B10 (FIG. 3B). Such conductive members may not provide sufficient compliance for some embodiments and may be used in conjunction with compliant members forming contacts at one or both ends of the conductive post. Compliant members may be added to complete the interposer of this example.

Figure 7:
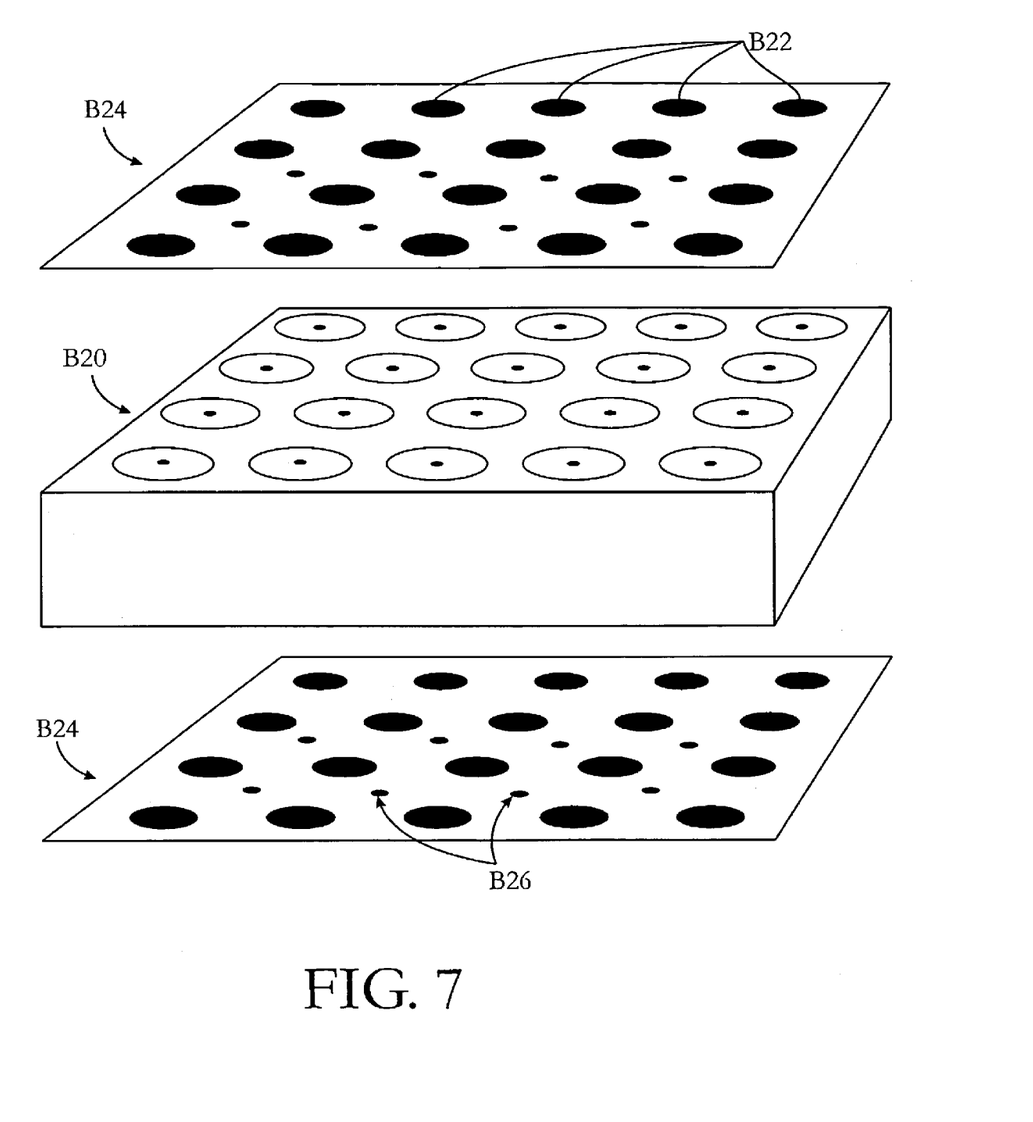
FIG. 7 is a perspective view, partially exploded, of a conductive housing with installed cylindrical inserts and top and bottom elastomeric contact sheets prior to installation.
Figure 8:
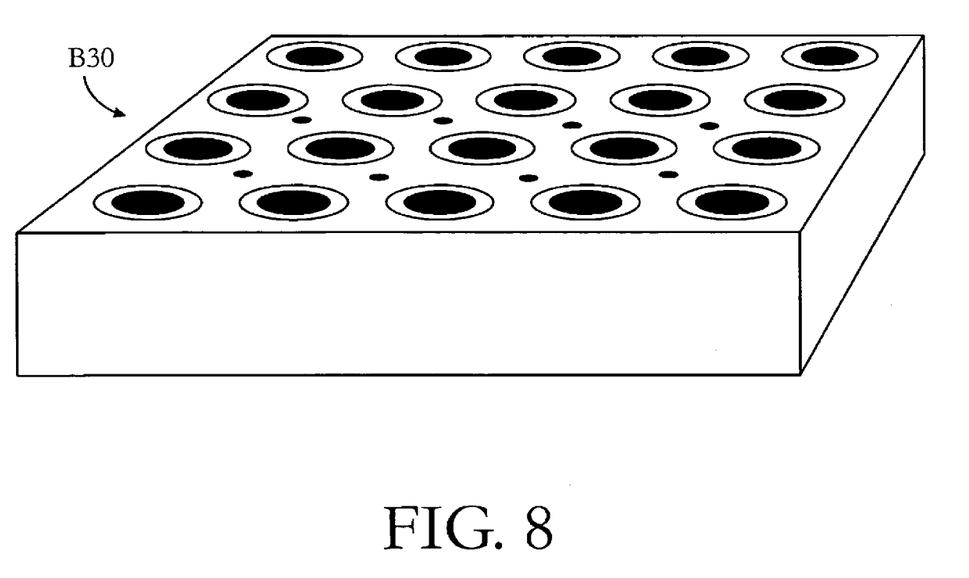
FIG. 8 is a perspective view of an interposer featuring a conductive housing, cylindrical inserts, and top and bottom elastomeric contacts.
Figure 9A:
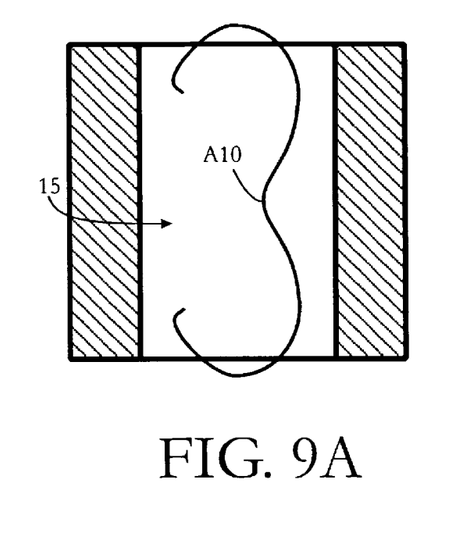
FIG. 9A is a cross-sectional side view of a grounded insert having a conductive spring A10 partially embedded in a conductive material 15.
Figure 9B:
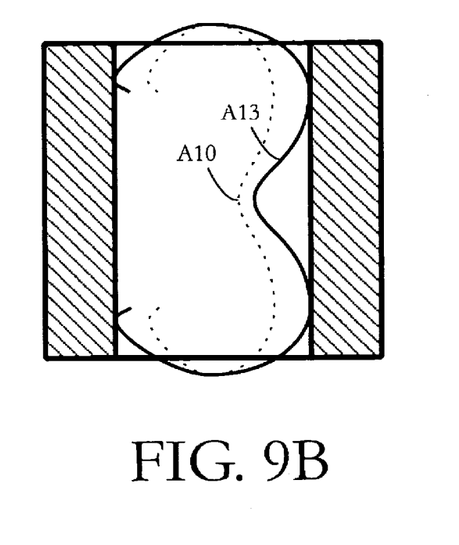
FIG. 9B is a cross-sectional side view of a grounded insert having a large conductive spring A13.
Figure 9C:
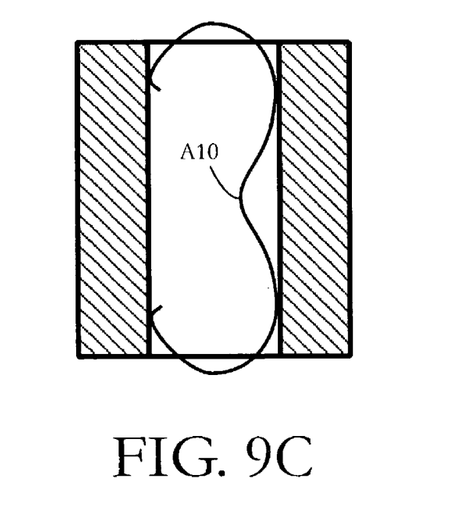
FIG. 9C is a cross-sectional side view of a grounded insert having a conductive spring A10 embedded in a narrow hole in the conductive housing.
Figure 9D:
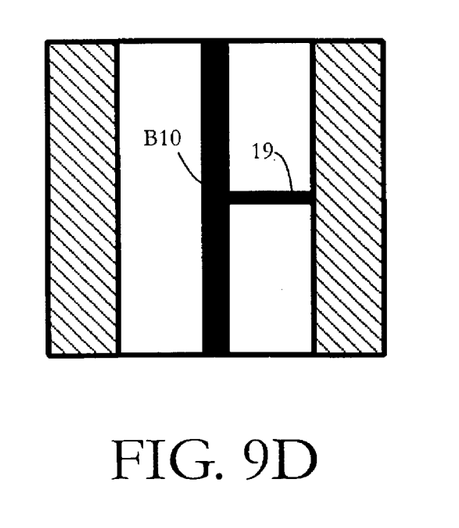
FIG. 9D is a cross-sectional side view of a grounded insert having a conductive post B10 and short 19.

FIG. 7 may represent interposer B20 at a subsequent stage of manufacture at which compliant members are added. FIG. 7 shows a partially completed interposer B20 with elastomeric contacts B22 about to be applied. In one embodiment, the elastomeric contacts B22 are provided in elastomeric contact sheets B24, such as are known in the art. The contacts are aligned with the conductive members and attached as shown in FIG. 8, which shows the completed interposer B30. The elastomeric contacts may be attached with conductive adhesive or in any other suitable way. In some embodiments, the sheet B24 may be attached to the housing using a non-conductive adhesive applied in locations where a conducting contact is not required. In other embodiments, a non-conducting adhesive may be used to attach the elastomeric contacts to insulative members.

As shown, the elastomeric contacts B22 do not contact the conductive housing B18. Sufficient clearance is provided to ensure that any expansion due to compression during use of the interposer does not lead to contact between the two. In the embodiments illustrated above, electrical isolation is provided between conductive members passing through interposer 2 and the conductive housing of interposer 2. With this configuration, each of the conductive members may be used to carry a signal through interposer 2.

In some embodiments, one or more of the conductive members passing through interposer 2 may be electrically connected to conductive housing 18. Accordingly, in some embodiments the conductive housing 18 and selected conductive members 10 are short circuited, dedicating these channels to ground. Each of FIGS. 9A-9D illustrate a cross-sectional view of a conductive member electrically connected to a conductive housing in an exemplary way. Diagonal lines represent the conductive housing. The electrical connection may be achieved in any suitable way that provides a sufficiently conducting path between the conductive member and the conductive housing. For example, a conductive material 15 (FIG. 9A) may be used rather than insulating member 14 (FIG. 2), a wide conductive member A13 (FIG. 9B) may be used in place of the conductive member A10 (superimposed), the size of the hole in conductive member 18 may be reduced (FIG. 9C), or a conductive member 10 may be connected to conductive member 18 via a short 19.

Connecting one or more of the conductive members to the conductive housing may allow compliant members on one or more ends of those conductive members to form a connection between conductive housing 18 and ground structures on either or both of the electronic assemblies joined by interposer 2. Though, other approaches may be used to provide electrical isolation. In some embodiments, the elastomeric material used to form elastomeric contact sheets B24 may have directionally conductive properties. Such material may, for example, be formed from a sheet of elastomeric material containing multiple conducting threads orientated generally perpendicular to the surfaces of sheet B24. With such a configuration, it is not necessary to have separate contacts aligned with conductive members carrying signals through interposer B20. Rather, appropriate connection may be made, without shorting the conductive members to each other or to the conductive housing, based on the directionally conductive properties of the elastomeric sheet.

Alternatively, structures for grounding the conductive housings A18, A19, and B18 may be implemented in some embodiments. For example, in FIG. 7, an elastomeric ground contact B26 may be used to provide contact between ground pads on surfaces of the electronic assemblies joined by interposer B30 and conductive housing B18.

Alternatively, other mechanisms for grounding conductive housing 18 may be used. For example, compliant pins, spring leads or other contact structures may be used to connect conductive housing 18 to one or more grounded structures on either or both of the electronic assemblies joined by interposer 2. Such connecting structures may be located on the electronic assembly or the conductive housing of interposer 2. In other embodiments, conductive housing 18 may be connected to ground by pressing it against a ground structure or in any other suitable way.

Interposer 2 may be constructed having any suitable dimensions with any suitable materials. For example, conductive housing 18 may be formed of metal or metallized components. As one example, conductive housing 18 may be die-cast using known diecasting techniques.

Insulative members, such as insulative member 14 may also be made of any suitable material. For example, the insulative members may be formed of a compliant material such as an elastomer. However, other materials such as plastics may alternatively or additional be used.

Similarly, any suitable material may be used to form conductive members. In some embodiments, the conductive members may be formed of a metal or metallized components. The conductive housing, however, need not be a highly conducting material such as a metal, and, in some embodiments, satisfactory performance may be achieved with housings having conductivities of only a few hundred siemens per meter. For example, some embodiments may employ materials providing a conductivity of 300 siemens per meter or higher. In other embodiments, materials with conductivities of 500 siemens per meter or higher may be used. Though, in other embodiments, materials of substantially higher conductivity may be used, such as die cast metals with conductivities in a range of $1.0 \times 10^6$ to $2.0 \times 10^7$ siemens per meter.

For conductive members incorporating spring contacts, a suitably springy material may be used. Examples of suitable material include copper alloys including berrillium copper and phosphor-bronze.

As an example, an embodiment of the invention may have a conductive housing formed from die-cast metal. The housing and inserts may have a height, h, of 2.75 mm. In some embodiments the insulative member 14 has a relative permittivity, $\epsilon_r$, ranging from 2.7-3.6. The spacing of conductive member's centers, d, is from 0.8 to 0.9 mm. The gap, g, between adjacent inserts of the conductive housing is at least 0.75 mm. Accordingly, in a maximum density configuration the radius, r, of the insert is 0.05 to 0.15 mm. Dimensions h, d, g, and r are labeled on FIG. 2.

Having thus described at least one illustrative embodiment of the invention, various alterations, modifications, and improvements will readily occur to those skilled in the art.

Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An interposer comprising:
   a. a conductive housing with a first side and a second side, the conductive housing having a plurality of holes, each hole passing through the first side and the second side;
   b. a plurality of insulators, each insulator at least partially embedded in a corresponding hole in the conductive housing; and
   c. a plurality of conductive springs, each having a first contact and a second contact, each conductive spring being partially embedded in at least one of the plurality of insulators such that the first contact of the conductive spring is exposed from the first side of the conductive housing and the second contact of the conductive spring is exposed from the second side of the conductive housing,
   wherein:
      i. each insulator of the plurality of insulators has a first surface and a second surface opposite the first surface, and the insulator is disposed such that the first surface of each insulator is exposed on the first side of the conductive housing and the second surface of each insulator is exposed on the second side of the conductive housing; and
      ii. the first contact of each spring of the plurality of conductive springs pierces the first surface of a corresponding insulator and the second contact of each spring of the plurality of conductive springs pierces the second surface of the corresponding insulator.

2. The interposer of claim 1, wherein the conductive housing is die-cast.

3. The interposer of claim 1, wherein the first side and second side of the conductive housing are parallel.

4. The interposer of claim 1, wherein the plurality of holes are perpendicular to the first surface.

5. The interposer of claim 1, wherein the first contact of each of the conductive springs has a U shaped curve wherein a base of the U shape is not embedded in the corresponding insulator.

6. The interposer of claim 1, wherein each of the plurality of insulators has a side surface adjacent to the conductive housing, and wherein the side surface is not pierced by the conductive spring.

7. The interposer of claim 1, further comprising a gold or silver plating on at least a portion of a conductive spring among the plurality of conductive springs.

8. The interposer of claim 1, further comprising a contact for grounding the conductive housing.

9. The interposer of claim 1, wherein an impedance measured between one of the plurality of conductive springs and the conductive housing is between 40 and 60 Ohms within the frequency range associated with data transfer rates of 2.5 to 10 Gbps.

10. An interposer comprising:
   a. a conductive housing with a first side and a second side opposite to the first side, having a plurality of holes, each hole passing through the first side and the second side;
   b. a plurality of insulators, each having a first surface and a second surface opposite the first surface, each insulator at least partially embedded in a corresponding hole in the conductive housing such that the first surface of each insulator is exposed from the first side of the conductive housing and the second surface of each insulator is exposed from the second side of the conductive housing;
   c. a plurality of conductive members, each having a first end and a second end, each conductive member partially embedded in at least one insulator of the plurality of insulators such that the first end of the conductive member is exposed on the first surface of the at least one insulator and the second end of the conductive member is exposed on the second surface of the at least one insulator;
   d. a first plurality of contacts, each one of the first plurality of contacts in contact with the first end of a corresponding conductive member; and
   e. a second plurality of contacts, each one of the second plurality of contacts in contact with the second end of a corresponding conductive member.

11. The interposer of claim 10, wherein the first plurality of contacts are elastomeric contacts.

12. The interposer of claim 11, wherein each of the first plurality of elastomeric contacts is insulated from the conductive housing.

13. The interposer of claim 10, wherein the conductive housing is die-cast.

14. The interposer of claim 10, wherein the first side and second side of the conductive housing are parallel.

15. The interposer of claim 10, further comprising a contact for grounding the conductive housing.

16. The interposer of claim 15, wherein the contact for grounding the conductive housing is an elastomeric contact.

17. A test system comprising:
   a. a plurality of instruments, each adapted to generate and/or measure a test signal;
   b. a first interface board comprising a first plurality of pads on a first surface, the first interface board being adapted to couple a test signal between a pad of the first plurality of pads and an instrument of the plurality of instruments;
   c. a second interface board comprising a second plurality of pads on a second surface, the second interface board adapted to couple a test signal between a pad of the second plurality of pads and a test point on a device under test; and
   d. an interposer disposed between the first interface board and the second interface board, the interposer comprising:
      i. a conductive housing with a first side and a second side opposite the first side, the conductive housing having a plurality of holes, each hole passing through the first side and the second side;
      ii. a plurality of insulators, each insulator being at least partially embedded in a corresponding hole in the conductive housing;
      iii. a plurality of conductive members, each having a first end and a second end, each conductive member being partially embedded in at least one of the plurality of insulators such that the first end of the conductive member is exposed from the first side of the conductive housing and the second end of the conductive member is exposed from the second side of the conductive housing; and
      iv. a ground contact coupling the conductive housing to a ground pad on at least one of the first interface board and the second interface board,
   wherein the first end of each conductive member is coupled to a pad of the first plurality of pads and the second end of each conductive member is coupled to a pad of the second plurality of pads.

18. The test system of claim 17, wherein the conductive housing of the interposer is die-cast metal.

19. The test system of claim 17, further comprising:
   i. a first plurality of contacts, each of the first plurality of contacts coupling a first end of a conductive member of the plurality of conductive members to a pad of the first plurality of pads; and
   ii. a second plurality of contacts, each of the second plurality of contacts coupling a first end of a conductive member of the plurality of conductive members to a pad of the second plurality of pads.

* * * * *